(12) United States Patent
Kondo et al.

(10) Patent No.: US 6,640,032 B2
(45) Date of Patent: Oct. 28, 2003

(54) BONDING STRUCTURES FOR OPTICAL MEMBERS

(75) Inventors: Jungo Kondo, Nagoya (JP); Tetsuya Ejiri, Nagoya (JP); Takashi Yoshino, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/961,786

(22) Filed: Sep. 24, 2001

(65) Prior Publication Data

US 2002/0114577 A1 Aug. 22, 2002

(30) Foreign Application Priority Data

Sep. 29, 2000 (JP) ........................................ 2000-298844

(51) Int. Cl.[7] .............................. G02B 6/26; G02B 6/42
(52) U.S. Cl. .............................. 385/51; 385/52; 385/49; 385/14; 385/129
(58) Field of Search .............................. 385/51, 52, 49, 385/14, 129

(56) References Cited

U.S. PATENT DOCUMENTS

| 4,857,130 A | 8/1989 | Curtis | |
|---|---|---|---|
| 5,119,452 A | * 6/1992 | Yokomori et al. | 385/36 |
| 5,425,118 A | * 6/1995 | Sugihara et al. | 385/51 |
| 5,669,997 A | 9/1997 | Robbert et al. | |
| 5,991,492 A | 11/1999 | Ota et al. | |
| 6,448,583 B1 | 9/2002 | Yoneda et al. | |
| 2001/0017964 A1 | * 8/2001 | Setoguchi | 385/88 |

FOREIGN PATENT DOCUMENTS

| DE | 44 24 013 | 7/1995 |
|---|---|---|
| EP | 1 134 605 A2 | 9/2001 |
| FR | 2 783 094 | 3/2000 |

* cited by examiner

*Primary Examiner*—Brian Healy
*Assistant Examiner*—Daniel Valencia
(74) *Attorney, Agent, or Firm*—Burr & Brown

(57) ABSTRACT

An optical member-bonding structure includes a first optical component, a second optical component, and an integral substrate having a mounting face on which the first and second optical components are mounted, at least the first optical member being bonded to the integral substrate, wherein a bonding face of the first optical member is bonded to the mounting face of the integral substrate with a cured and shrunk optical adhesive in such a state that an optical axis of the first optical member is aligned with that of the second optical member at a precision of not more than 1 $\mu$m, a groove is formed in a such bonding region of that mounting face of the integral substrate as being bonded with the first optical member, and at least part of the optical adhesive is filled into the groove.

17 Claims, 2 Drawing Sheets

BONDING STRUCTURES FOR OPTICAL MEMBERS

BACKGROUND OF THE INVENTION (1) Field of the Invention

The present invention relates to bonding structures for optical members, particularly, to bonding structures in which plural optical members such as a laser diode and an optical waveguide substrate are bonded to a mount, while optical axes of the plural optical members are aligned with each other in an order of submicrons (i.e. not more than 0.2 μm). The invention also relates to a method for producing such bonding structures.

(2) Related Art Statement

Second Harmonic Generation (SHG) devices of a quasi phase-matched (QPM) type using optical waveguides in which a periodical domain inversion structure is formed in a single crystal of lithium niobate or lithium tantalate have been used as light sources for blue lasers to be used in optical pickups, for example. Such devices may be applied to a wide region including optical disc memories, medical uses, optochemical uses, various optical measurements, etc.

In order to produce such devices, it is necessary to prepare an optical waveguide substrate provided with a periodical domain inversion structure, fixing the optical waveguide substrate and a laser diode onto a mount, and aligning an optical axis of the optical waveguide of the optical waveguide substrate with that of the laser diode in an order of submicrons.

As such an assembling method, a so-called active alignment method is available, which is not suitable for mass production because a long time is required to make the assembling. On the other hand, according to a passive alignment method and a semi-passive alignment method, a marker is provided on a surface (mounting face) of an integral substrate made of silicon or silicon carbide, and optical members are aligned with reference to the marker. In this case, they are fixed by resin curing, solder fixing, YAG welding or the like. JP-A 6-338650 describes such a method, for example.

When a semiconductor laser diode and an optical waveguide substrate are to be aligned, bonded and fixed on a mounting face of an integral substrate with reference to a marker, it is necessary that the aligning adjustment is effected in a horizontal (width) direction of the substrate, a gap between the semiconductor laser diode and the optical waveguide substrate is adjusted, and the diode and the optical waveguide substrate are adjusted in height. Among the above adjustments, it is difficult to particularly align the height of an optical axis of an active layer of the diode with that of an optical axis of the optical waveguide at a high precision as measured from the mounting face of the substrate. This precision is required to be not more than 0.2 μm, for example. However, when the diode and the optical waveguide substrate are fixed onto the mounting face of the integral substrate with the resin, it is actually difficult to control variations in thickness of the resin to not more than 0.2 μm.

The reason for the above is that it is difficult to accurately coat a necessary amount of the optical adhesive over the entire bonding face of the mount, depending upon influences of the viscosity of the optical adhesive and the wetting property of the mount, which is likely to cause an uneven optical adhesive layer on the bonding face. Particularly in case that the resin is to be applied and cured after the optical members are aligned with each other, a space to be coated with the resin is small in the state that the optical components are aligned, which makes working difficult and uniform coating very difficult.

There are some reasons why the optical axes-aligning precision for the optical members decreases, following curing and shrinkage. For example, in an embodiment of FIG. 2(a), an optical waveguide substrate 10 is arranged on a mounting face 3b of a unitary substrate 3 with an optical adhesive 5A. In this figure, reference numerals 10a, 10b and 10c are an upper face, a bonding face and a side face of the substrate 10, respectively. A part of the optical adhesive 5A flows out from the side face 10c of the substrate 10 to form meniscuses as shown by 12. If each meniscus 12 non-uniformly shrinks when the optical adhesive is cured and shrunk, the substrate 10 is pulled as shown by an arrow direction A, and inclined, which deteriorates the precision in the optical axis-alignment.

In an example of FIG. 2(b), since an optical adhesive layer 5B is thick, a shrunk amount is large in a direction of an arrow B, which causes variations in the optical axis-aligning precision. In an example of FIG. 2(c), a left side portion of the optical bonding adhesive 5C is thicker, while a right portion is thinner. Consequently, the substrate 10 remains inclined after the adhesive is cured and shrunk.

In order to prevent reduction in precision of the optical axis-alignment which follows the above curing and shrinkage, it is necessary to make the thickness of the optical adhesive thinner and also reduce the curing shrinkage. If the viscosity of the optical adhesive is high, the thickness of the optical adhesive is likely to become greater. On the other hand, it is easy to reduce the coated thickness of the optical adhesive having a lower viscosity, but its curing shrinkage rate is often large. Owing to these factors, when optical members are to be mass produced, it is difficult to align the optical axes of the optical members two-dimensionally in a precision order of submicrons with an enhanced yield.

SUMMARY OF THE INVENTION

It is an object of the present invention, which is directed to a bonding structure for optical members including a first optical member, a second optical member, and an integral substrate having a mounting face on which the first and second optical components are mounted, with at least the first optical member being bonded to the integral substrate, to prevent reduction in the optical axes-alignment precision of the first and second optical members following curing and shrinkage of the optical adhesive. It is a further object of the present invention to reduce variations in light amount on applications of temperature cycles.

The present invention is directed to the bonding structure for optical members including a first optical member, a second optical member, and an integral substrate having a mounting face on which the first and second optical members are mounted. At least the first optical member is bonded to the integral substrate, and a bonding face of the first optical member is bonded to the mounting face of the integral substrate with a cured and shrunk optical adhesive in such a state that an optical axis of the first optical member is aligned with that of the second optical member at a precision of not more than 1μm. A groove is formed in the bonding region of the mounting face of the integral substrate bonded with the first optical member, and at least part of the optical adhesive is filled into the groove.

These and other features, advantages and effects of the invention will be appreciated upon reading of the following description of the invention when taken in conjunction with the attached drawings, with the understanding that some modifications, variations and changes of the same could be made by the skilled person in the art to which the invention pertains without departing from the scope or spirit of the present invention.

BRIEF DESCRIPTION OF THE DRAWINGS

For a better understanding of the invention, reference is made to the attached drawings, wherein.

DETAILED DESCRIPTION OF THE INVENTION

Figure 1:
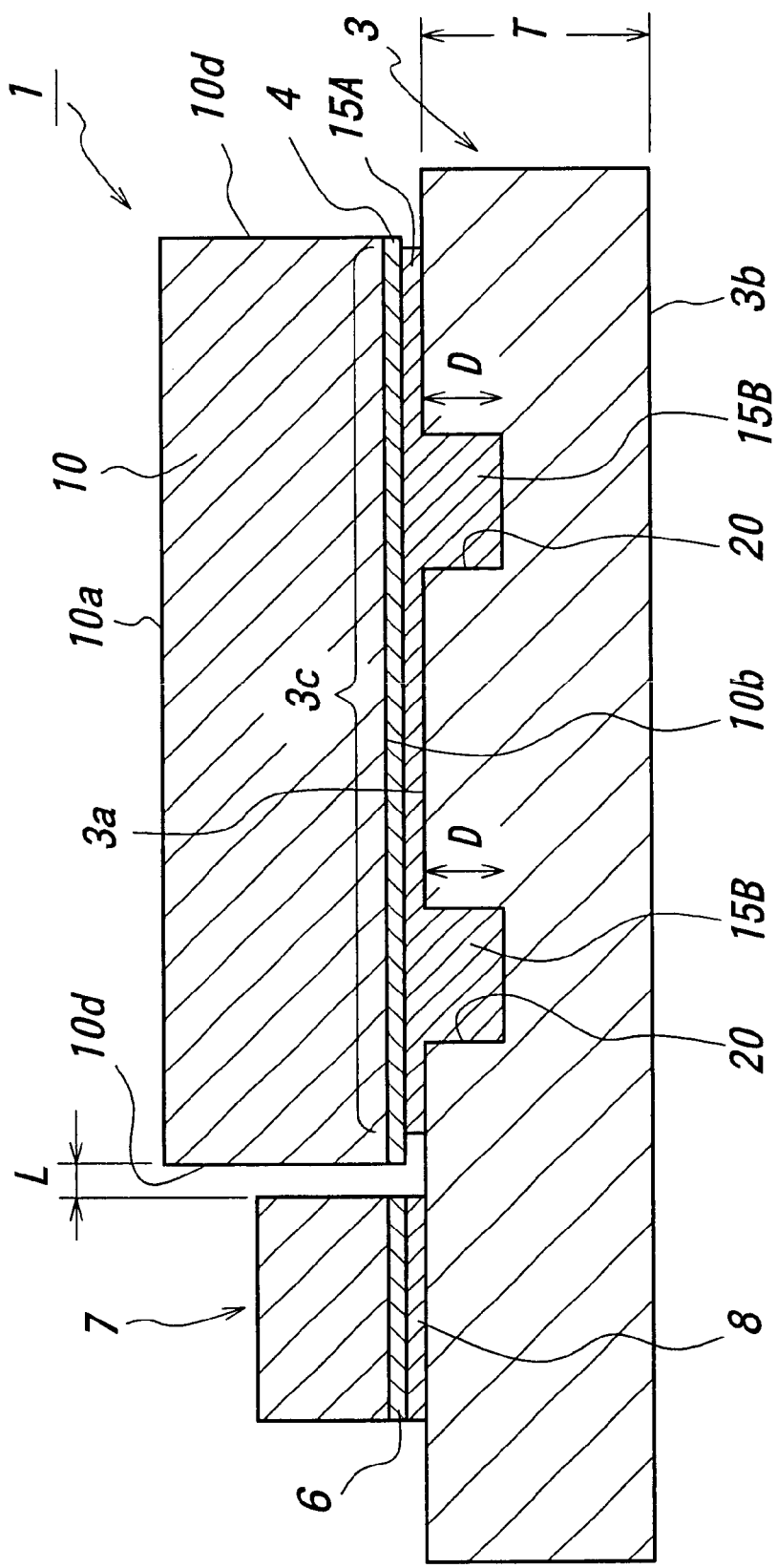
FIG. 1 is a sectional view of schematically showing one embodiment of the bonding structure according to the present invention, wherein an optical waveguide substrate 10 and a semiconductor laser diode chip 7 are mounted on an integral substrate 3.
Figure 2A:
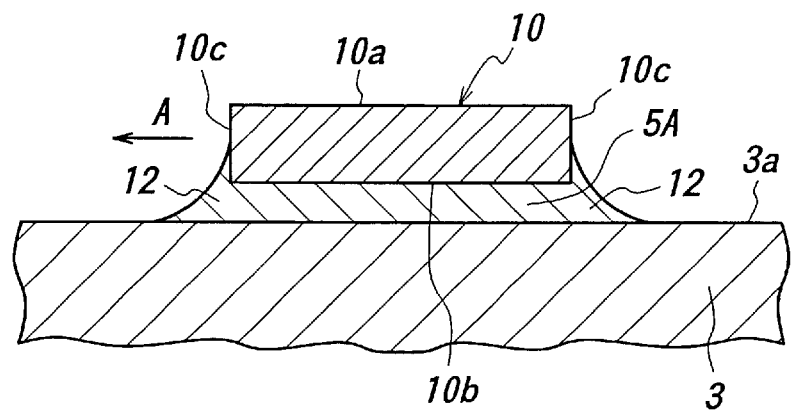
FIGS. 2(a), (b) and (c) are sectional views of schematically illustrating examples in which an integral substrate 3 is bonded to an optical waveguide substrate 10.
Figure 2B:
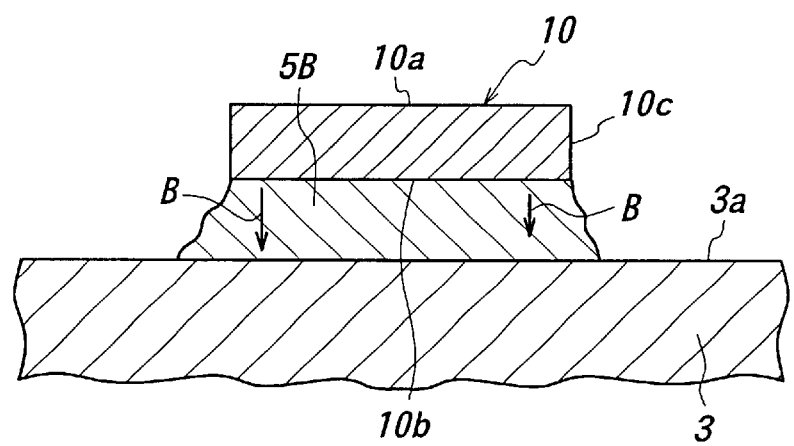
Figure 2C:
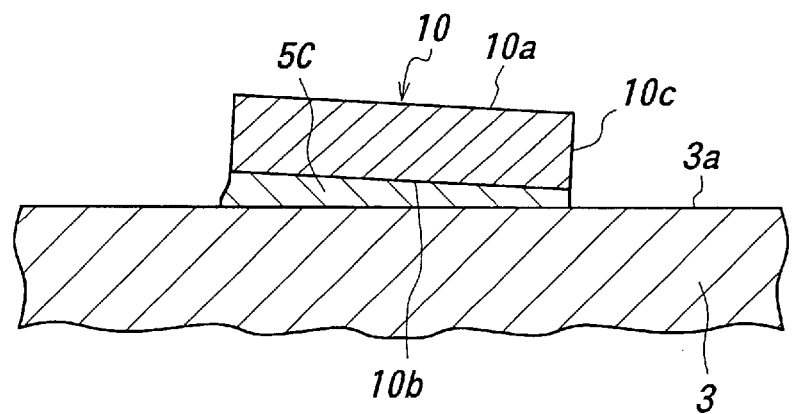

The present inventors succeeded in preventing lateral overflow of an excess amount of the optical adhesive and excess thickness of the optical adhesive between the integral substrate and the optical member, as well as preventing a reduction in the optical axis-alignment precision due to the curing and shrinking of the optical adhesive, through providing a groove at an appropriate depth in the mounting face of the integral substrate and filling at least a part of the optical adhesive into the groove.

Further, the depth of the groove can be adjusted to control the amount of the optical adhesive remaining between the mounting face of the substrate and the bonding face of the first optical member. Thereby, the thickness of the adhesive layer can be optimized and the bonding strength between the optical member and the substrate can be maximized. Thus, variations in light amount can be reduced even upon application of temperature cycles when the bonding structure is exposed to a wide temperature range.

It is clarified that particularly when the resin is applied to the mounting face of the substrate via the groove, the resin uniformly spreads also onto a flat portion with no groove through a capillary action, so that the thickness of the resin at the flat portion is ordinarily not more than 3 $\mu$m with variations in the resin layer being not more than 0.2 $\mu$m, for example.

As the first optical member, optical fiber arrays may be provided by way of example in addition to optical waveguide substrates (including SHG elements). As the second optical member, light-emitting diodes and optical fiber arrays may be provided in addition to laser diodes.

In the present invention, the second optical member may be bonded to the mounting face of the integral substrate. In this case, a similar groove as mentioned above may be provided in a bonding area of the mounting face of the substrate to the second optical member.

As the material for the optical waveguide substrate, mention may be made of $LiNbO_3$, $LiTaO_3$, $LiNbO_3$-$LiTaO_3$ solid solution, lithium potassium niobate, lithium potassium niobate-lithium potassium tantalate solid solution and $KTiOPO_4$, for example.

The term "integral substrate" means herein a substrate molded as a unitary body from a fundamentally homogeneous material. For example, a bonded body in which two substrates are bonded is excluded from the integral substrate. The integral substrate is not limited to any outer contour, so long as the integral substrate has at least a flat mounting face. Although the material for the integral substrate is not particularly limited, a material selected from the group consisting of silicon, aluminum nitride, silicon carbide and diamond is preferred.

Although the optical adhesive is not particularly limited, an adhesive selected from a UV curable type resin, a visual light curable type resin, an instantaneous adhesive resin and an anaerobic curable type resin is preferred. As the UV curable type resin, an epoxy-based resin and a modified acrylate-based resin are available. As the instantaneous adhesive resin, a cyanoacrylate-based resin is available. As the anaerobic resin, an acryl-based resin is available.

The depth of the groove is preferably 5 to 200 $\mu$m. When the depth of the groove is not less than 5$\mu$m, variations in the thickness of the resin at the flat portion are remarkably reduced, and the light loss upon application of temperature cycles also remarkably decreases. From this point of view and from the point of view of resin applicability, the depth of the groove is more preferably not less than 25$\mu$m.

On the other hand, when the depth of the groove is not more than 200 $\mu$m, variations in light amount originating from warping of the substrate upon application of temperature cycles are suppressed. Further, if the depth of the groove exceeds 200 $\mu$m, the substrate is likely to be warped in forming the groove (mechanical working, laser processing, etching or the like), and the flatness of the plane of the substrate is deteriorated by such warping. As a result, the light loss immediately after assembling tends to become larger. From this point of view, the thickness of the groove is more preferably not more than 150 $\mu$m.

From the standpoint of reducing variations in the light amount upon application of temperature cycles, the width of the groove is particularly preferably 0.1 to 5 mm.

From the standpoint of suppressing variations in the light amount upon application of temperature cycles, the thickness of the adhesive layer at an area other than the groove is preferably 1 to 3 $\mu$m.

The precision in aligning the optical axis of the first optical member with that of the second optical member is not more than 1 $\mu$m. The precision of not more than 0.5 $\mu$m, particularly not more than 0.2 $\mu$m is particularly preferable for the present invention.

FIG. 1 is a sectional view for schematically illustrating one embodiment of the bonding structure according to the present invention. In this embodiment, an integral substrate 3 has a planar shape. The substrate 3 has a mounting face 3a and a bottom face 3b.

On the mounting face 3a are mounted an optical waveguide substrate 10 and a semiconductor laser diode chip 7. A general mounting procedure will be described. First, the bottom face 3b of the substrate 3 is arranged at a given location. Then, the chip 7 is fixed onto the mounting face 3a of the substrate 3 with a joining agent 8. This joining agent may be a solder, a welding layer, or an optical adhesive as mentioned above. Among them, the solder or the optical adhesive is preferred. At this time, the chip 7 is positionally aligned. An active layer 6 of the chip 7 is provided downwardly.

A given amount of groove(s) 20 is (are) formed in a given size at the mounting face 3a of the substrate 3. The groove(s) exists (exist) within the bonding area 3c of the mounting face 3a. A main plane 10b of the substrate 10 is bonded to the bonding area 3c of the mounting face 3a. No optical waveguide is provided on an upper face 10a of the substrate 10, and an optical waveguide 4 is provided on the main plane 10b.

Preferably, the substrate 10 is positionally aligned in a lateral direction (a perpendicular direction to the paper in FIG. 1), whereas a gap L between an end face 10d of the substrate 10 and that of the chip 7 is adjusted. In this state, although an optical axis of the active layer 6 is aligned with that of the optical waveguide 4 at a precision of not more than 1 μm one-dimensionally (in the perpendicular direction to the paper), they are not severely adjusted in a longitudinal direction (a parallel direction to the paper) in FIG. 1.

Next, a UV curable type resin is applied to the bonding area 3c, mainly into the grooves 20, of the mounting face of the substrate 3. At this time, the applied resin liquid is usually spread in a substantially uniform thickness between the bonding face 10b of the substrate 10 and the mounting face 3a of the substrate 3 by the capillary phenomenon. Then, the resin is cured upon being irradiated with ultraviolet rays. As a result, the cured optical adhesive 15B is filled in each of the grooves 20, and the cured adhesive 15A is interposed between the mounting face 3a and the bonding face 10b of the substrate 10 as the adhesive layer 15A. This adhesive layer 15A is preferably present from the standpoint of stability against the temperature cycles, but it is not indispensable.

When the optical adhesive finishes curing and shrinkage thereof, the optical axis of the active layer 6 is aligned with that of the optical waveguide 4 at a precision of not more than 1 μm as viewed in the longitudinal direction in FIG. 1.

In this way, the optical waveguide of the first optical member is preferably aligned with that of the second optical member at the precision of not more than 1 μm in a plane vertical to these optical axes.

In the following, concrete experimental results will be explained.

A bonding structure as shown in FIG. 1 was prepared according to the above mentioned method. The substrate 3 was made of silicon, and had dimensions of 15.0 mm×15.0 mm×2.0 mm in thickness T. An SHG element 10 was prepared from a single crystal of magnesium-doped lithium niobate, and had dimensions of 10 mm×3 mm×0.5 mm. A UV curable type adhesive was used as an optical adhesive, and filled in the grooves with a dispenser. A chip 7 was soldered to a substrate 3. The optical axes of the first and second optical members were aligned at a precision of not more than 0.2 μm. The gap L was 3 μm.

Two rows of the grooves 20 were provided at the mounting face 3a of the substrate 3. Each groove was traversed in a lateral direction of the mounting face 3a. The groove 20 had a width of 3 mm, while its depth D was changed as shown in Table 1.

After the bonding structure was produced, a laser beam having a wavelength of 840 nm was emitted from the semiconductor laser diode chip 7, and the intensity PO of a second harmonic wave (emitted light) from the optical waveguide 4 was measured. Then, 1000 temperature cycles were applied between −40° C. and +85° C., and the intensity P1 of the emmited light after temperature cycles was measured. The change in the light amount (P0–P1) was calculated.

TABLE 1

| Depth D of groove (μm) | Change in light amount (dB) |
| --- | --- |
| 0 | 1.00 |
| 5 | 0.30 |
| 25 | 0.20 |
| 50 | 0.19 |
| 60 | 0.17 |
| 75 | 0.16 |
| 100 | 0.15 |
| 150 | 0.20 |
| 200 | 0.29 |
| 225 | 0.50 |
| 250 | 0.80 |

As is shown from table 1, when the adhesive was applied via the grooves 20 and spread via the grooves, the change in the light amount after the temperature cycles could be more reduced in the groove-provided cases as compared with a case in which a groove depth was 0 mm (no groove was provided).

Particularly when the depth of the groove was 5 to 200 μm, the change in the light amount could be more reduce to not more than 0.3 dB. The change in the light amount could be reduced to not more than 0.2 dB by setting the depth of the groove to 25 to 150 μm.

As having been described above, the optical member-bonding structure according to the present invention comprises the first optical member, the second optical member, and the integral substrate having the mounting face upon which the first and second optical members are mounted, at least the first optical member being bonded to the substrate, wherein a bonding face of said first optical member is bonded to the mounting face of the integral substrate with a cured and shrunk optical adhesive in such a state that an optical axis of the first optical member is aligned with that of the second optical member at a precision of not more than 1 μm, a groove is formed in a such bonding region of that mounting face of the integral substrate as being bonded with the first optical member, and at least part of the optical adhesive is filled into said groove. Thereby, reduction in precision of alignment of the optical axes between the first and second optical members due to the curing and shrinkage of the optical adhesive can be reduced, so that the change in the light amount upon application of temperature cycles can be reduced.

What is claimed is:

1. A bonding structure for optical members, comprising a first optical member, a second optical member, and an integral substrate having a mounting face on which the first and second optical members are mounted, at least said first optical member being bonded to the integral substrate at a bonding region including a main plane surface and at least one groove formed in the integral substrate, wherein a bonding face of said first optical member is bonded to the main plane surface and said at least one groove with a cured and shrunk optical adhesive in such a state that an optical axis of the first optical member is aligned with the optical axis of the second optical member at a precision of not more than 1 μm, and at least part of the optical adhesive is filled into said at least one groove.

2. The bonding structure set forth in claim 1, wherein the groove has a depth of 5 to 200 μm.

3. The bonding structure set forth in claim 2, wherein the groove depth is not more than 150 μm.

4. The bonding structure set forth in claim 2, wherein the groove depth is not less than 25 μm.

5. The bonding structure set forth in claim 1, wherein the groove has a width of 0.1 to 5 μm.

6. The bonding structure set forth in claim 5, wherein a bonding layer of said optical adhesive is interposed between the bonding face of the first optical member and the mounting face of the integral substrate and at a location different from said groove, and said bonding layer has a thickness of 1 to 3 µm.

7. The bonding structure set forth in claim 1, wherein a bonding layer of said optical adhesive is interposed between the bonding face of the first optical member and the mounting face of the integral substrate and at a location different from said groove, and said bonding layer has a thickness of 1 to 3 µm.

8. The bonding structure set forth in claim 1, wherein the first member is an optical waveguide substrate provided with an optical waveguide, said second optical member is a laser diode, and an optical axis of the laser diode is aligned with the that of the optical waveguide at a precision of not more than 1 µm.

9. The bonding structure set forth in claim 8, wherein the laser diode is bonded to the mounting face of the integral substrate with a cured and shrunk optical adhesive, a groove is formed at such a bonding region of the mounting face for the laser diode, and a part of the optical adhesive is present in the groove.

10. The bonding structure set forth in claim 1, wherein said optical adhesive is selected from the group consisting of a UV curable type resin, a visual light curable type resin, an instantaneous adhesive and an anaerobic curable type resin.

11. The bonding structure set forth in claim 2, wherein said optical adhesive is selected from the group consisting of a UV curable type resin, a visual light curable type resin, an instantaneous adhesive and an anaerobic curable type resin.

12. The bonding structure set forth in claim 7, wherein a film of gold is formed on the bonding face of the laser diode, and the optical adhesive is an acrylic-based UV curable resin.

13. The bonding structure set forth in claim 8, wherein a film of gold is formed on the bonding face of the laser diode, and the optical adhesive is an acrylic-based UV curable resin.

14. The bonding structure set forth in claim 6, wherein said integral substrate is selected from the group consisting of silicon, aluminum nitride, silicon carbide and diamond.

15. The bonding structure set forth in claim 11, wherein said integral substrate is selected from the group consisting of silicon, aluminum nitride, silicon carbide and diamond.

16. The bonding structure set forth in claim 7, wherein said integral substrate is selected from the group consisting of silicon, aluminum nitride, silicon carbide and diamond.

17. The bonding structure set forth in claim 8, wherein said integral substrate is selected from the group consisting of silicon, aluminum nitride, silicon carbide and diamond.

* * * * *

UNITED STATES PATENT AND TRADEMARK OFFICE
CERTIFICATE OF CORRECTION

PATENT NO. : 6,640,032 B2  Page 1 of 1
DATED : October 28, 2003
INVENTOR(S) : Jungo Kondo, Tetsuya Ejiri and Takashi Yoshino It is certified that error appears in the above-identified patent and that said Letters Patent is hereby corrected as shown below:

<u>Title page,</u>
Item [57], ABSTRACT,
Line 2, please change "component, a second optical component," to -- member, a second optical member, --
Line 4, please change "mounted, at" to -- mounted. At --
Line 5, please change "being" to -- is --
Lines 10-11, please change "$\mu$m, a" to -- $\mu$m. A --
Line 11, please change "a such" to -- the --
Line 11, please change "that" to -- the --
Line 12, please delete "as being".

Signed and Sealed this

Sixteenth Day of December, 2003

JAMES E. ROGAN
*Director of the United States Patent and Trademark Office*